US008420491B2

(12) United States Patent
Utomo et al.

(10) Patent No.: US 8,420,491 B2
(45) Date of Patent: Apr. 16, 2013

(54) STRUCTURE AND METHOD FOR REPLACEMENT METAL GATE FIELD EFFECT TRANSISTORS

(75) Inventors: Henry K. Utomo, Hopewell Junction, NY (US); Unoh Kwon, Hopewell Junction, NY (US); Dimitri Anastassios Levedakis, Hopewell Junction, NY (US); Ravikumar Ramachandran, Hopewell Junction, NY (US); Viraj Yashawant Sardesai, Hopewell Junction, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 12/942,097

(22) Filed: Nov. 9, 2010

(65) Prior Publication Data

US 2012/0112290 A1    May 10, 2012

(51) Int. Cl.
*H01L 21/336* (2006.01)
(52) U.S. Cl.
USPC ........... 438/300; 257/369; 257/377; 257/204; 257/E27.046; 438/299; 438/199

(58) Field of Classification Search .................. 257/369, 257/377; 438/300
See application file for complete search history.

(56) References Cited

U.S. PATENT DOCUMENTS

| | | | |
|---|---|---|---|
| 5,310,692 A | 5/1994 | Chan et al. | |
| 5,536,684 A | 7/1996 | Dass et al. | |
| 5,874,765 A | 2/1999 | Lee et al. | |
| 5,958,505 A | 9/1999 | Mantl | |
| 6,034,410 A | 3/2000 | Chan et al. | |
| 6,096,643 A | 8/2000 | Nariman et al. | |
| 6,165,902 A | 12/2000 | Pramanick et al. | |
| 6,194,296 B1 | 2/2001 | Lien | |
| 6,369,429 B1 | 4/2002 | Pramanick et al. | |
| 6,548,875 B2 * | 4/2003 | Nishiyama | 257/377 |
| 6,579,765 B1 | 6/2003 | Ellis | |
| 7,528,432 B2 * | 5/2009 | Sashida | 257/306 |
| 7,569,456 B2 * | 8/2009 | Ko et al. | 438/300 |

* cited by examiner

*Primary Examiner* — Eva Yan Montalvo
(74) *Attorney, Agent, or Firm* — Yuanmin Cai; Howard M Cohn (57) ABSTRACT

A structure and method for replacement metal gate (RMG) field effect transistors is disclosed. Silicide regions are formed on a raised source-drain (RSD) structure. The silicide regions form a chemical mechanical polish (CMP) stopping layer during a CMP process used to expose the gates prior to replacement. Protective layers are then applied and etched in the formation of metal contacts.

12 Claims, 11 Drawing Sheets

STRUCTURE AND METHOD FOR REPLACEMENT METAL GATE FIELD EFFECT TRANSISTORS

FIELD OF THE INVENTION

The present invention pertains to semiconductor fabrication. More specifically, the present invention pertains to fabrication of field effect transistors.

BACKGROUND OF THE INVENTION

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of graded well-doping, epitaxial wafers, halo implants, tip implants, lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Recently, metal gate electrodes have evolved for improving the drive current by reducing polysilicon depletion. In replacement metal gate processes, controlling gate open during the polishing step adversely impacts efforts to maintain a consistent gate height. This often necessitates increasing the incoming gate height has to be increased to compensate gate loss during planarization steps. However, the increased gate height causes undesirable effects such halo implant shadowing. Accordingly, a need exists for an improved methodology enabling the fabrication semiconductor devices comprising transistors with replacement metal gate electrodes.

SUMMARY

In one embodiment of the present invention, a method of fabricating a semiconductor structure is provided. The method comprises forming an NFET gate and a PFET gate on a surface of a substrate, and then forming a raised source and raised drain adjacent to the NFET gate and forming a raised source and raised drain adjacent to the PFET gate. Silicide regions are formed on the raised source and raised drain adjacent to the NFET gate and PFET gate. Then, at least one protective layer is deposited over the surface of the semiconductor structure. This is followed by planarizing the semiconductor structure to remove the protective layer to the level of the silicide regions, such that the raised source and raised drain of the PFET and NFET, and the PFET and NFET gates are of equal height above the surface of the substrate.

In another embodiment of the present invention, a semiconductor structure has a substrate with a PFET and an NFET, the PFET and NFET each having a gate, a raised source, and a raised drain. Silicide regions are disposed on the raised source and raised drain of the NFET and the raised source and raised drain of the PFET. A nitride layer is disposed above the gate of the NFET and the gate of the PFET and a contact metal layer is disposed above the silicide regions.

In yet another embodiment of the present invention, a semiconductor structure has a substrate with a PFET and an NFET, each having a gate. A SiGe material is disposed below and adjacent the gate of the PFET, and silicon material is disposed on the substrate adjacent to gate of the NFET. There is also silicon material disposed on the substrate adjacent to gate of the PFET and on the SiGe material. Silicide regions are on the silicon material adjacent to the gate of the NFET and to the gate of the PFET. Furthermore, a nitride layer is disposed above the gate of the NFET and above the gate of the PFET. A contact metal layer, disposed above the silicide regions, is recessed to a level below the top of the nitride layer disposed above the gate of the NFET and above the gate of the PFET. The gate of the PFET is constructed of a material selected from the group consisting of: ruthenium; palladium; platinum; cobalt and nickel. The gate of the NFET is of a material selected from the group consisting of hafnium; zirconium; titanium; tantalum and aluminum.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

DETAILED DESCRIPTION

Figure 1:
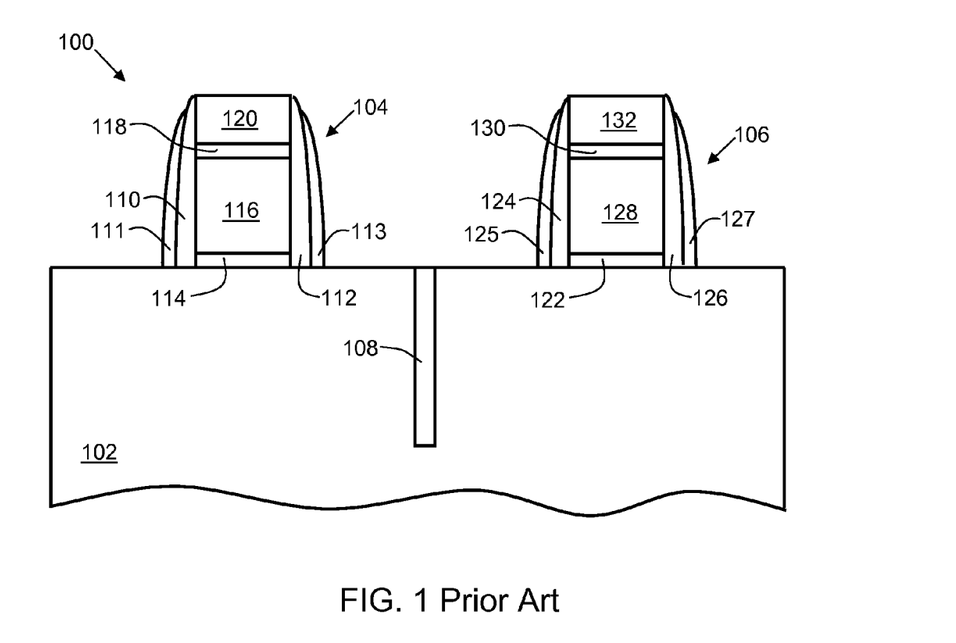
FIG. 1 is a prior art semiconductor structure which serves as a starting point for fabrication of a structure in accordance with an embodiment of the present invention.

FIG. 1 is a prior art semiconductor structure 100 which serves as a starting point for fabrication of a structure in accordance with an embodiment of the present invention. Semiconductor structure 100 comprises a silicon substrate 102. Two field effect transistors (FETs) are present on substrate 102, NFET 104 and PFET 106. NFET 104 and PFET 106 are separated by shallow trench isolation (STI) region 108. NFET 104 comprises gate oxide layer 114, gate 116, gate top oxide layer 118, and gate top nitride layer 120. Side spacers 110 and 112, comprised of nitride, are adjacent to the gate 116. An additional set of nitride spacers 111 and 113 are adjacent to spacers 110 and 112 respectively.

Similarly, PFET 106 comprises gate oxide layer 122, gate 128, gate top oxide layer 130, and gate top nitride layer 132. Side spacers 124 and 126, comprised of nitride, are adjacent to the gate 116. An additional set of nitride spacers 125 and 127 are adjacent to spacers 124 and 126 respectively.

Figure 2:
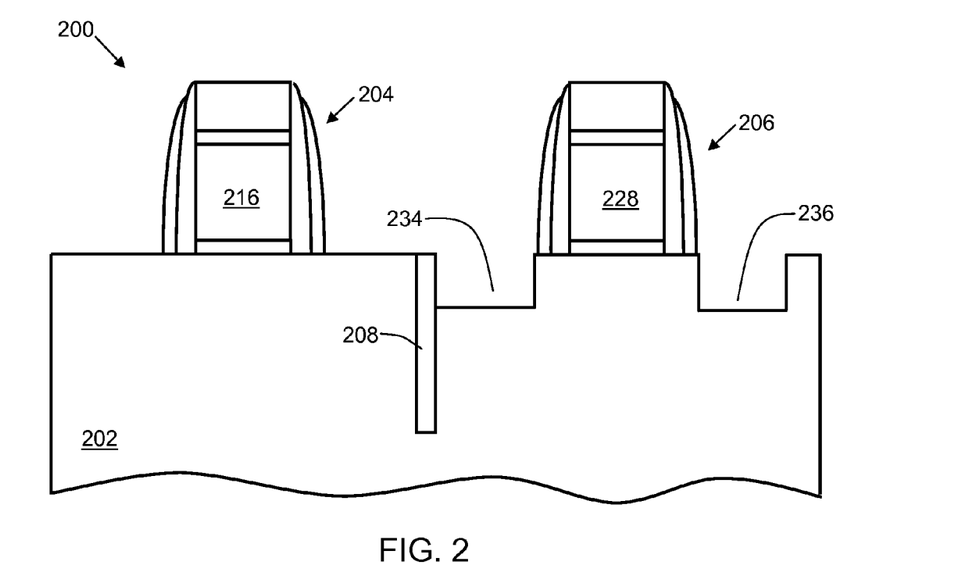
FIG. 2 illustrates an intermediate process step of forming recesses adjacent to the PFET gate.

FIG. 2 shows a semiconductor structure 200 after an intermediate processing step. In this processing step, the substrate adjacent to PFET 206 is etched to form recesses 234 and 236. This etch may be performed using a RIE (reactive ion etch) process. In one embodiment, the recesses 234 and 236 are 15 to 65 nanometers deep. Well-known lithographic techniques may be used to form areas of resist (not shown) to protect various parts of structure 200 during the RIE process. This resist is then removed, resulting in semiconductor structure 200 as shown in FIG. 2. As stated previously, similar elements may be referred to by similar numbers in various figures (FIGs) of the drawing, in which case typically the last two significant digits may be the same. For example, STI region 208 is similar to STI region 108 of FIG. 1.

Figure 3:
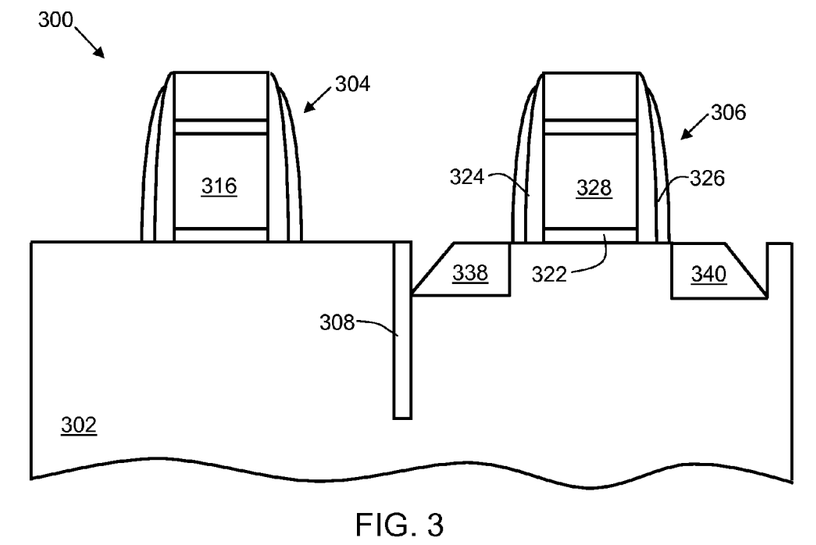
FIG. 3 illustrates an intermediate process step of growing SiGe in the recesses.

FIG. 3 shows a semiconductor structure 300 after an intermediate processing step. In this processing step, (silicon-germanium) regions 338 and 340 are epitaxially grown in the recesses (234 and 236 of FIG. 2) below and adjacent to spacers 324 and 326 at the base of the gate of PFET 306. SiGe has a larger lattice constant than silicon, and so regions 338 and 340 serve to induce compressive channel strain. This strain enhances hole mobility, which is beneficial for PFET operation.

Figure 4:
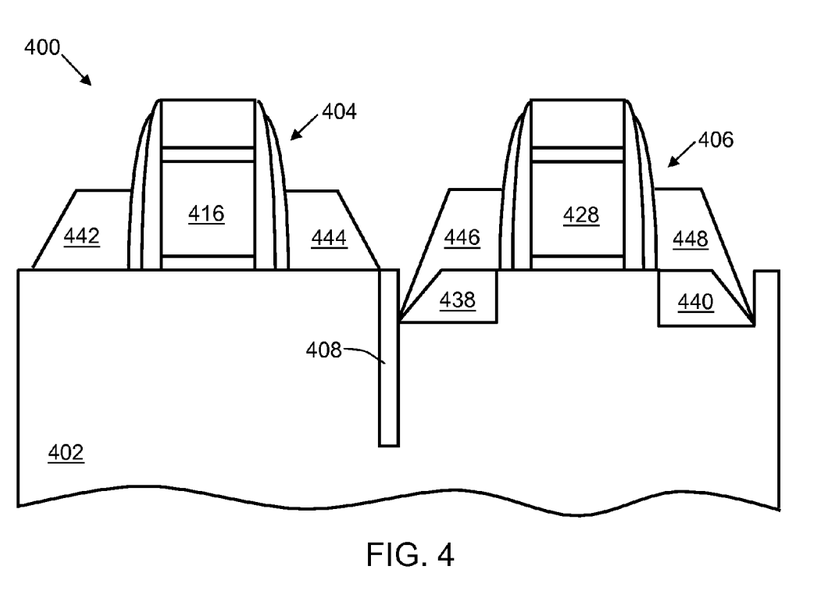
FIG. 4 illustrates an intermediate process step of growing epitaxial silicon to from raised source and drain regions.

FIG. 4 shows a semiconductor structure 400 after an intermediate processing step. In this processing step, epitaxial silicon regions 442 and 444 are grown on the NFET 404, and epitaxial silicon regions 446 and 448 are grown on the PFET 406. Hence, NFET 404 and PFET 406 are raised source-drain (RSD) devices, since silicon regions 442, 444, 446, and 448, which will become sources and drains of the completed semiconductor, are disposed above substrate 402.

Figure 4B:
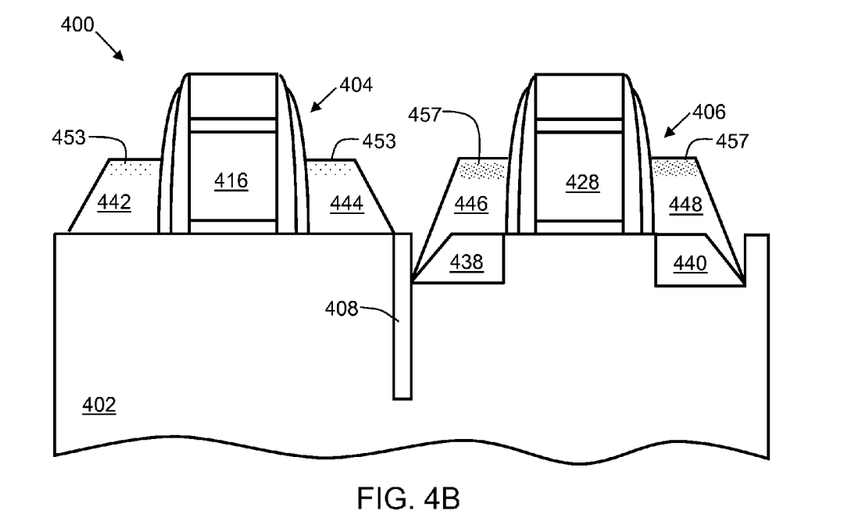
FIG. 4B illustrates an intermediate process step of source and drain implantation.

FIG. 4B shows a semiconductor structure 400 after an intermediate processing step. In this processing step, source and drain implanting is separately performed on both NFET 404 and PFET 406. One FET is masked while the other FET receives its implant. For example, in one embodiment, PFET 406 is first masked while NFET 404 receives implant species 453. Then, NFET 404 is masked while PFET 406 receives implant species 457. In one embodiment, implant species 453 is comprised of arsenic, and implant species 457 is comprised of boron.

Figure 5:
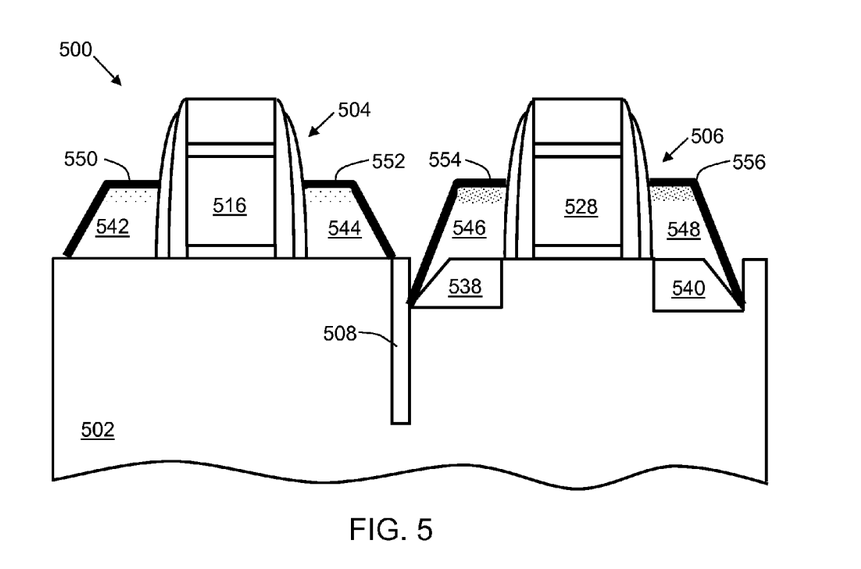
FIG. 5 illustrates an intermediate process step of silicide formation.

FIG. 5 shows a semiconductor structure 500 after an intermediate processing step. In this processing step, an anneal is performed to activate dopants. In one embodiment, the anneal is performed at a temperature ranging from 950 degrees Celsius to 1150 degrees Celsius for a time ranging from 1 second to 30 seconds. In one embodiment, a laser anneal is used for the annealing step. In another embodiment, a rapid thermal anneal (RTA) is used for the annealing step. After the anneal, silicide regions 550, 552, 554, and 556 are formed. The silicide regions may be formed in a variety of ways, such as by deposition of the pure metal onto the silicon region or simultaneous evaporation of the silicon and the metal (co-evaporation). A sputter-deposition process may also be used to form the silicide. In one embodiment, the silicide regions 550, 552, 554, and 556 are comprised of a Nickel Silicide. In another embodiment, the silicide regions 550, 552, 554, and 556 are comprised of a Cobalt Silicide. Other silicide materials may also be used.

Figure 6:
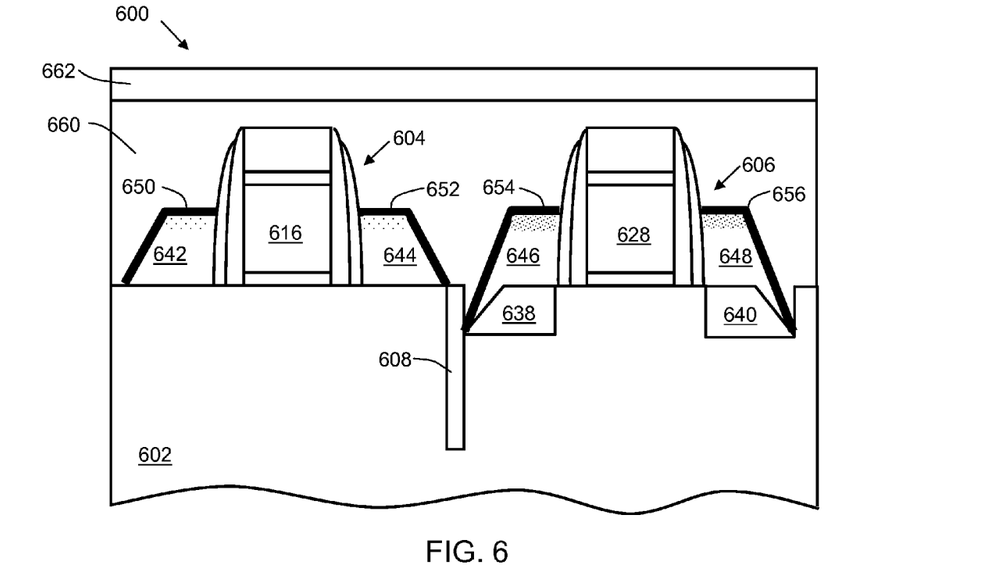
FIG. 6 illustrates an intermediate process step of deposition of layers of oxide and nitride.

FIG. 6 shows a semiconductor structure 600 after an intermediate processing step. In this processing step, nitride layer 660 and oxide layer 662 are deposited over the semiconductor structure 600. In one embodiment, layers 660 and 662 are deposited via chemical vapor deposition.

Figure 7:
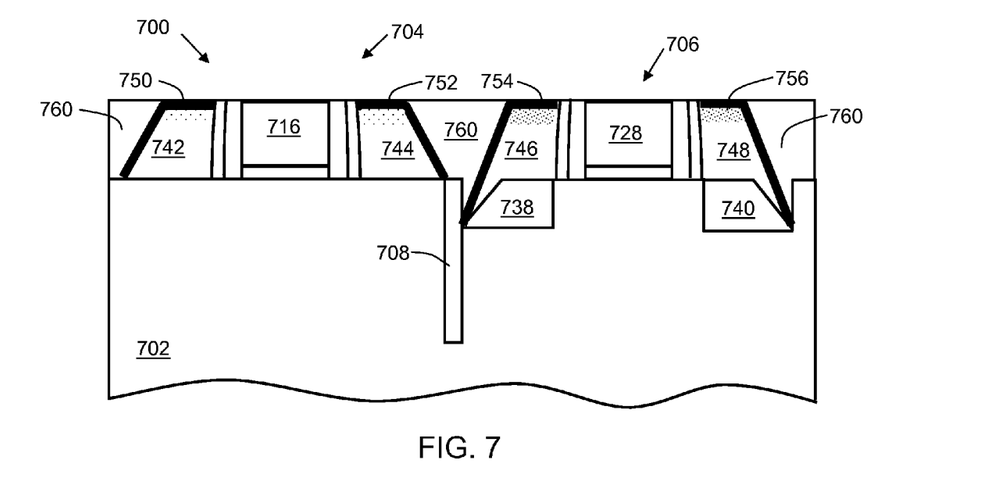
FIG. 7 illustrates an intermediate process step of planarization.

FIG. 7 shows a semiconductor structure 700 after an intermediate processing step. In this processing step, the entire structure 700 is planarized to the level of silicide regions 750, 752, 754, and 756. Portions of the nitride layer 660 shown in FIG. 6 remain, and are indicated by reference number 760 in FIG. 7. A portion of gate 616 and 628 of FIG. 6 also remain in FIG. 7, indicated as 716 and 728. Hence, the silicide regions which form the raised source and drain serve as a CMP (chemical mechanical polish) stopping layer.

Figure 8:
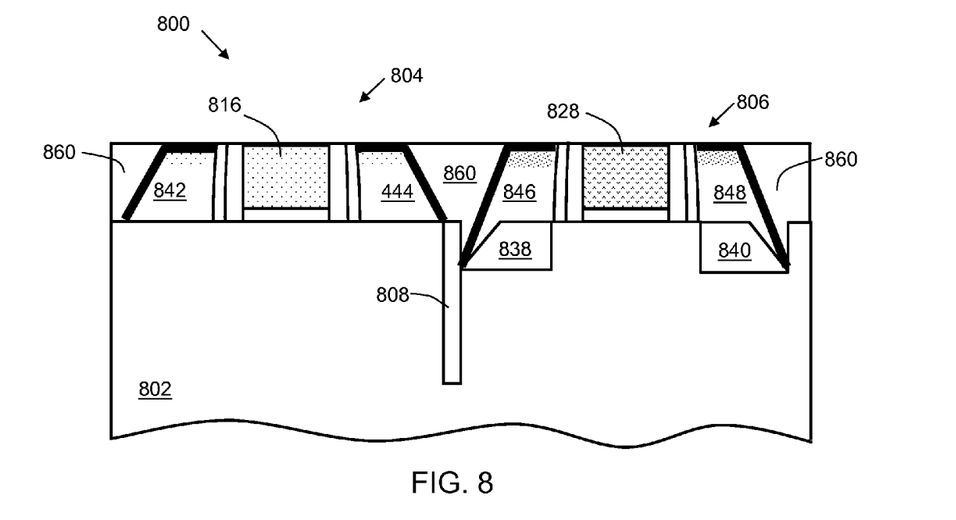
FIG. 8 illustrates an intermediate process step of forming a replacement metal gate (RMG) for the NFET and the PFET.

FIG. 8 shows a semiconductor structure 800 after an intermediate processing step. In this processing step, gates 716 and 724 are removed by etching, and replacement gates 816 and 824 are put in the place where gates 716 and 724 had occupied. This is accomplished by using industry-known lithographic methods to protect one FET (e.g. 804 or 806) while depositing the replacement gate material for the other FET. In one embodiment, the RMG material 816 for NFET 804 comprises one of hafnium, zirconium, titanium, tantalum, aluminum, and their alloys, e.g., metal carbides that include these elements, i.e., hafnium carbide, zirconium carbide, titanium carbide, tantalum carbide, and aluminum carbide. In one embodiment, the RMG material 828 for the PFET 806 comprises one of ruthenium, palladium, platinum, cobalt, nickel, and conductive metal oxides, e.g., ruthenium oxide. In addition, aluminum, titanium, lanthanum, and hafnium can also be used for the PFET RMG material.

In prior art RMG processes, maintaining a consistent gate height during CMP is a major issue. With embodiments of the present invention, by using the silicide of the RSD as the stopping layer, a more consistent gate height is achieved. As an added benefit, the RSD structure simplifies some of the steps of contact formation, as will be further described in the following paragraphs.

Figure 9:
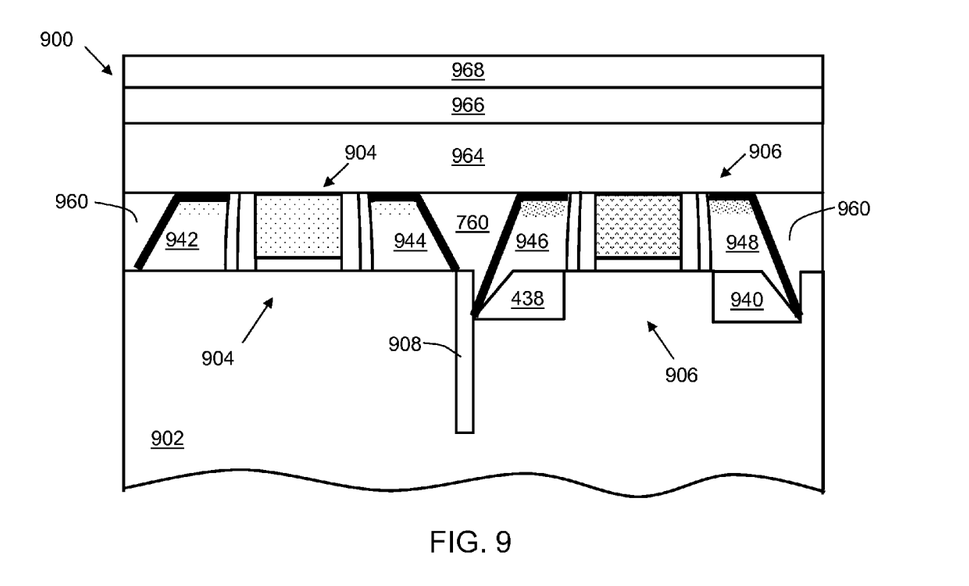
FIG. 9 illustrates an intermediate process step of depositing a plurality of film layers.

FIG. 9 shows a semiconductor structure 900 after an intermediate processing step. In this processing step, film layers 964, 966 and 968 are deposited on structure 900. In one embodiment, film layer 964 and film layer 968 are nitride layers, and film layer 966 is an oxide layer. In another embodiment, film layer 964 and film layer 968 are oxide layers, and film layer 966 is a nitride layer. The thickness of film layer 964 is greater than or equal to the thickness of film layer 968. The thickness of layer film 964 is limited by the planarizing technology in use. For example, if the CMP (chemical mechanical polish) process in use is limited to about 200 angstroms, then the minimum thickness of layer 964 is 200 angstroms. If the CMP (chemical mechanical polish) process in use is limited to about 100 angstroms, then the minimum thickness of film layer 964 is 100 angstroms, and so on.

Figure 10A:
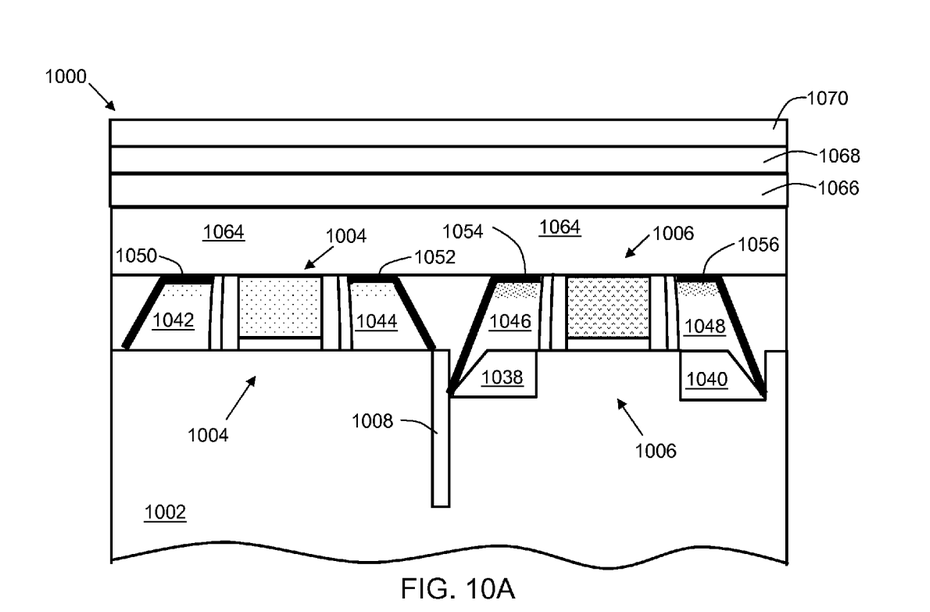
FIG. 10A illustrates an intermediate process step of depositing a resist layer.
Figure 10B:
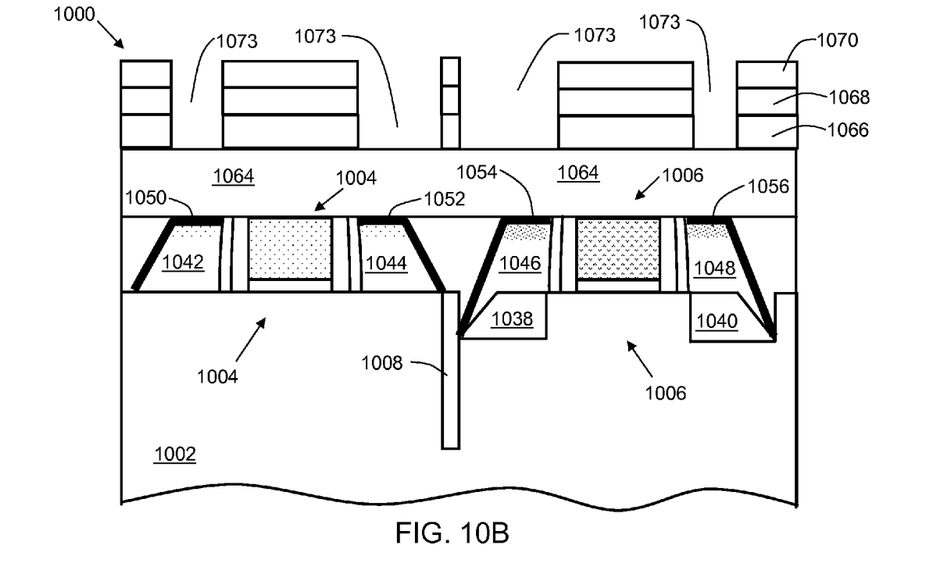
FIG. 10B illustrates an intermediate process step of forming cavities above the silicide regions.

FIG. 10A shows a semiconductor structure 1000 after an intermediate processing step. In this processing step, resist layer 1070 is deposited over the structure 1000. Then, as shown in FIG. 10B, using industry-known lithographic techniques, the resist is removed at areas directly above the silicide regions 1050, 1052, 1054, and 1056. Then, layers 1068 and 1066 are etched, forming cavities 1073 that expose layer 1064. In one embodiment, the etching of layers 1068 and 1066 is performed with a reactive ion etch (RIE), and a 50/50 line-to-space ratio is achieved, to etch according to the so-called lithographic "sweet spot" which provides for an optimal lithography.

Figure 11A:
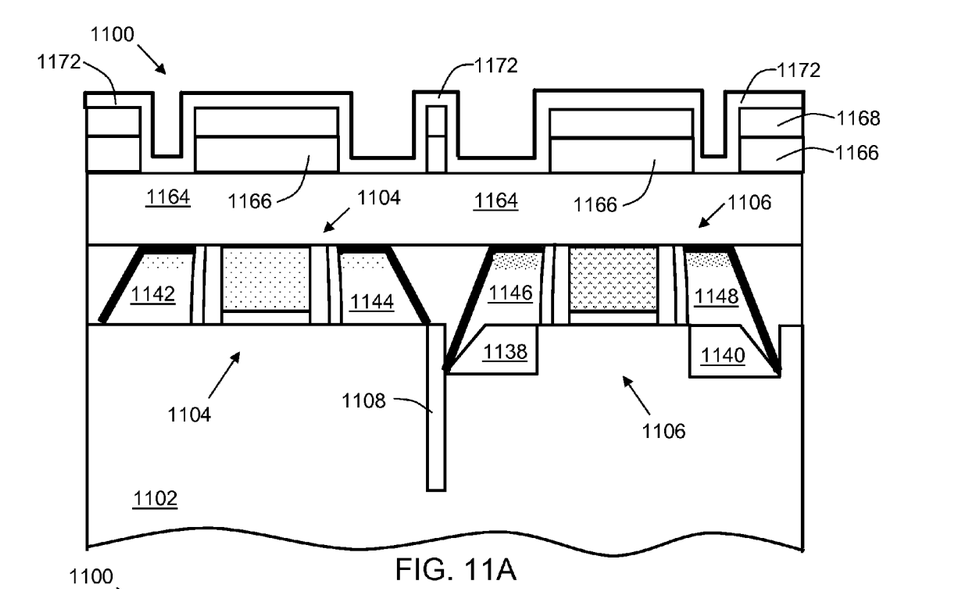
FIG. 11A illustrates an intermediate process step of depositing a conformal nitride layer.
Figure 11B:
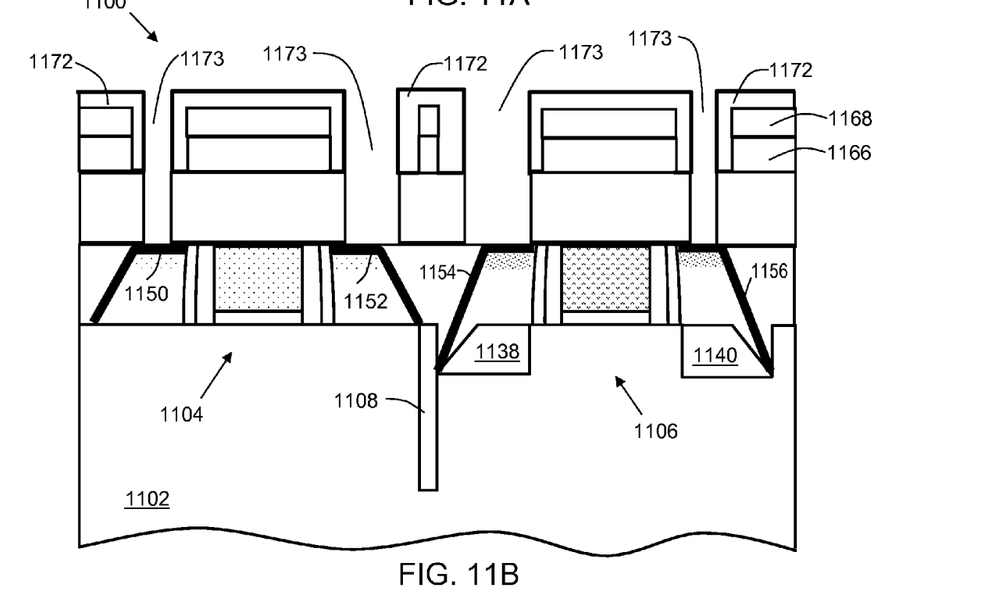
FIG. 11B illustrates an intermediate process step of extending the cavities to the silicide regions.

FIG. 11A shows a semiconductor structure 1100 after an intermediate processing step. In this processing step, the resist layer (1070 of FIG. 10B) is removed, and then a conformal film layer 1172 is deposited. In one embodiment, conformal film layer 1172 is a conformal nitride layer. In FIG. 11B, the conformal nitride layer 1172 is then etched to the silicide regions 1150, 1152, 1154, and 1156 and forms cavities 1173 (by extending cavities 1073 of FIG. 10B). In one embodiment, this etch is performed via RIE. In a subsequent processing step, cavities 1173 are filled with a metal to form contacts. The thicker the layer 1172 is, the narrower the cavities 1173 are. Hence, the thickness of layer 1172 can be varied enable a controlled contact formation process, and in particular, to alter the contact width, where a thicker layer 1172 results in a narrower contact. This is important for the fabrication process, since if the contact width is not properly controlled, the contact width may be too wide, and undesirably encroach into the nitride regions 1166 above the gates of the NFET 1104 and PFET 1106.

Figure 12:
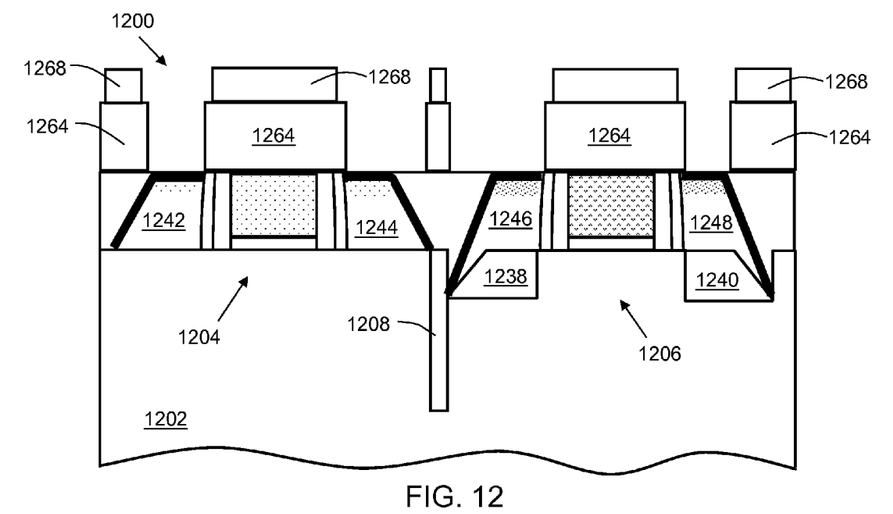
FIG. 12 illustrates an intermediate process step of removing the conformal nitride layer.

FIG. 12 shows a semiconductor structure 1200 after an intermediate processing step. In this processing step, the conformal nitride layer 1172, and layer 1168 (see FIG. 11B) are removed. In one embodiment, a wet etch is used to remove nitride layer 1172 and layer 1168. In one embodiment, layer 1168 is also a nitride layer. In that case, the resulting structure 1200 has oxide portions 1268 that are slightly narrower than remaining nitride portions 1264, due to the different etch rates of the oxide and nitride during the wet etch.

Figure 13:
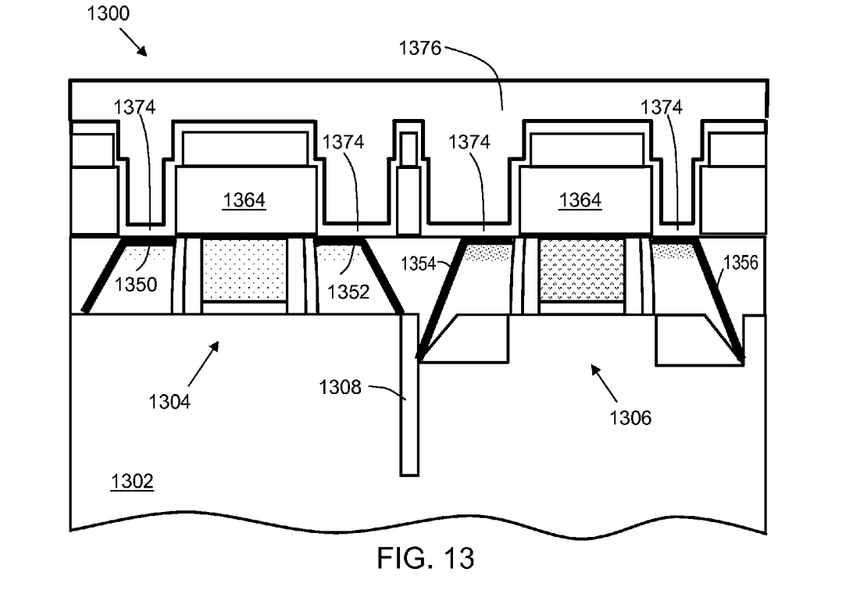
FIG. 13 illustrates an intermediate process step of depositing a contact metal.

FIG. 13 shows a semiconductor structure 1300 after an intermediate processing step. In this processing step, a liner metal layer 1374 is deposited over structure 1300. In one embodiment, liner metal layer 1374 is titanium nitride, and in one embodiment, the thickness of layer 1374 ranges from 2 nanometers to 11 nanometers (nm). Next, a contact metal layer 1376 is deposited over structure 1300, so that the liner metal layer 1374 is disposed between the contact metal layer 1376 and the silicide regions 1350, 1352, 1354, and 1356. In one embodiment, contact metal layer 1376 is tungsten. In another embodiment, contact metal layer 1376 is copper.

Figure 14:
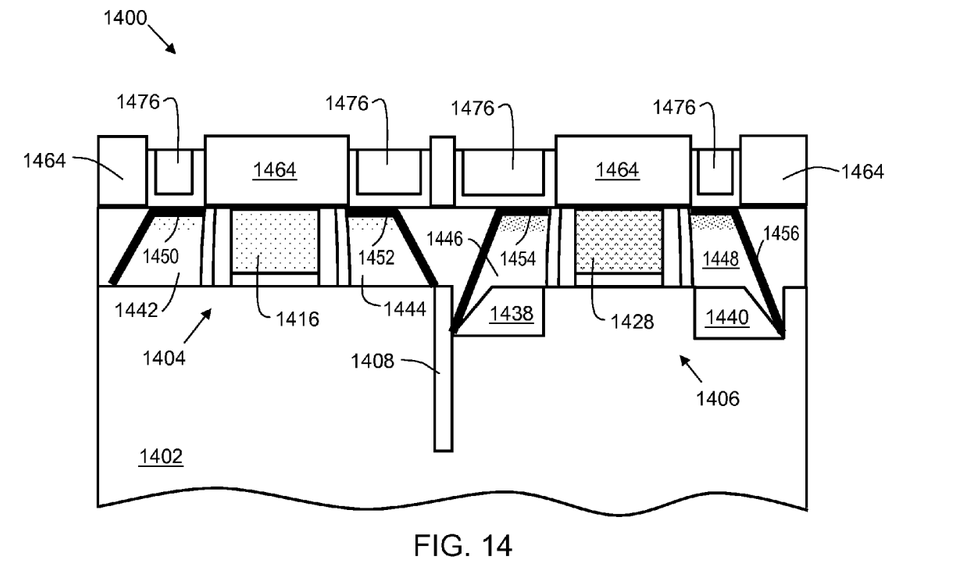
FIG. 14 illustrates process steps of planarization and touch-up RIE.

FIG. 14 shows a semiconductor structure 1400 after an intermediate processing step. In this processing step, metal layer 1376 (see FIG. 13) is planarized, forming metal layer regions 1476 over silicide regions 1450, 1452, 1454, and 1456. Then, a touch-up RIE is optionally performed on the metal regions 1476 to slightly recess them below the level of the top of nitride layer 1464. In certain situations, the touch-up RIE reduces the risk of puddles of remaining metals due to CMP variability. From this point, structure 1400 is processed through industry standard BEOL steps to complete fabrication of a semiconductor device.

Figure 15:
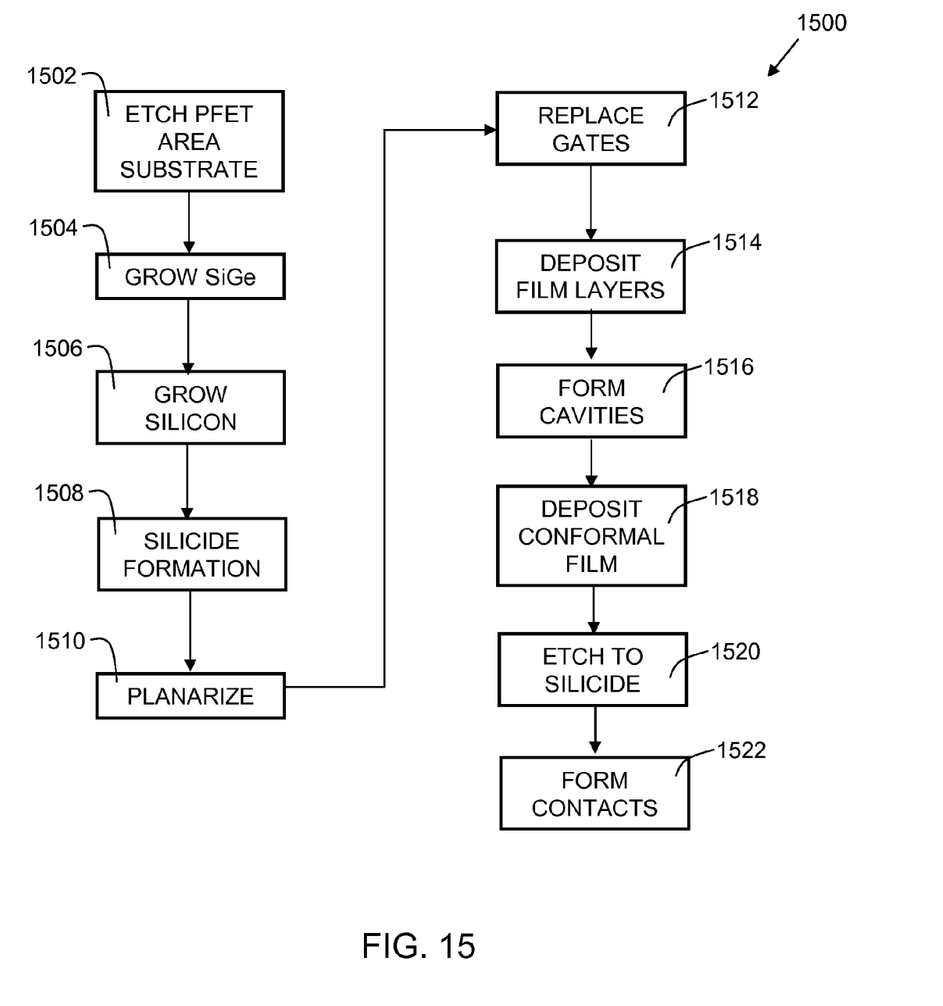
FIG. 15 is a flowchart in accordance with an embodiment of the present invention.

FIG. 15 is a flowchart 1500 indicating process steps for embodiments of the present invention. In process step 1502, the substrate near the PFET is recessed with an etch (see 234 and 236 of FIG. 2). In process step 1504, SiGe is epitaxially grown in the recessed area of the PFET (see 338 and 340 of FIG. 3). In process step 1506, silicon is epitaxially grown for the NFET and the PFET (see 442, 444, 446 and 448 of FIG. 4). In process step 1508, silicide regions are formed (see 550, 552, 554, and 556 of FIG. 5). In process step 1510, the structure is planarized to the level of the silicide regions (see 700 of FIG. 7). In process step 1512, the original gates are replaced with metal gates, by etching the original gate material, and depositing a metal gate material for the NFET and PFET (see 800 of FIG. 8). In process step 1514, film layers are deposited (see 900 of FIG. 9). In process step 1516, cavities are formed in the film layers (see 1073 of FIG. 10B). In process step 1518, a conformal film is deposited (see 1172 of FIG. 11A). In process step 1520, the cavities are etched expose the silicide regions (see 1100 of FIG. 11B). In process step 1522, contacts are formed within the cavities (see 1476 of FIG. 14).

Figure 16:
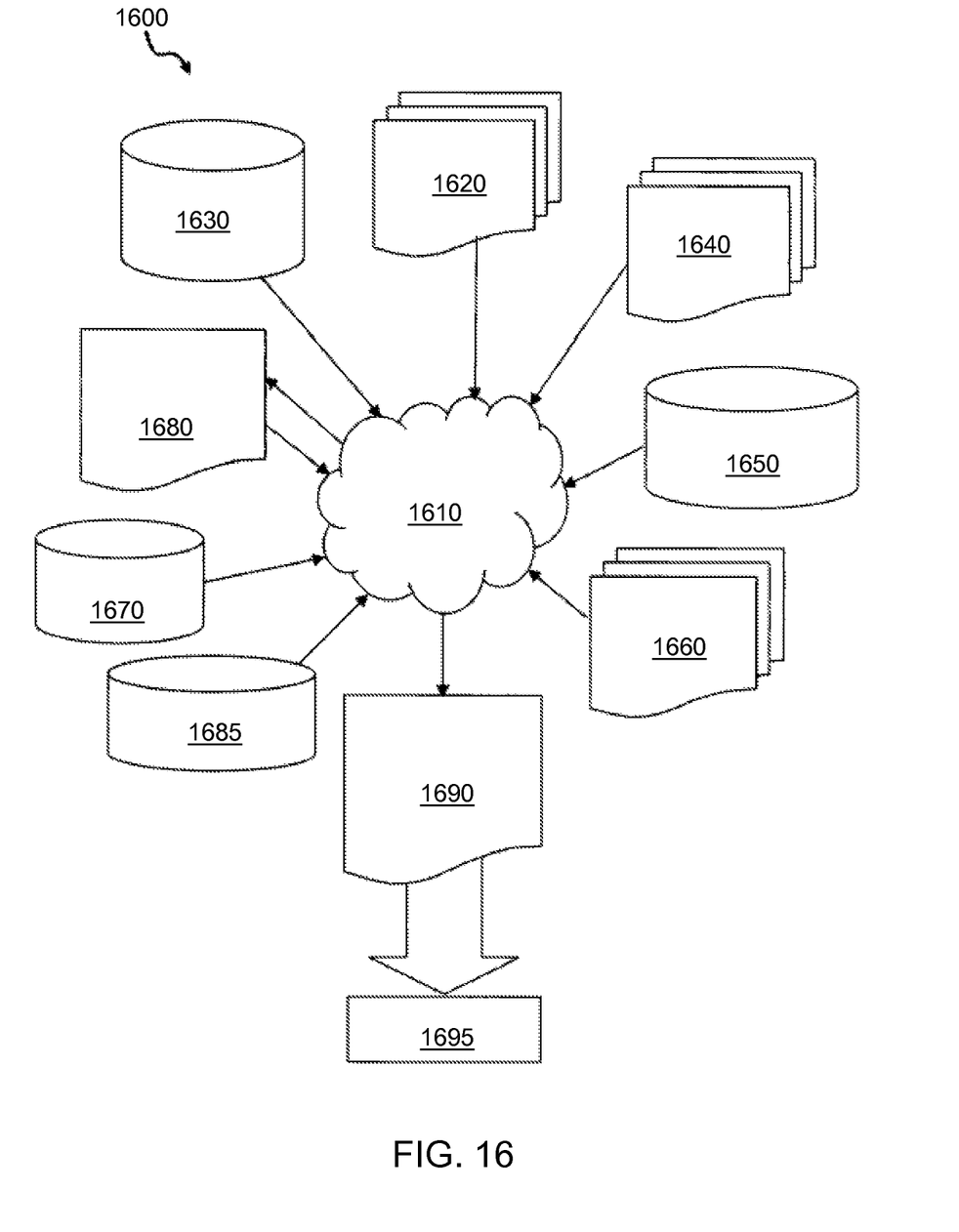
FIG. 16 shows a block diagram of an exemplary design flow.

FIG. 16 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 2-14. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 2-14. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 2-14 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 2-14, along with any additional integrated circuit design or data (if applicable), into a second design structure 1690. Design structure 1690 resides on a storage medium in a data format used for the exchange of layout data of integrated circuits (e.g. information stored in a GDSII (GDS2), GLI, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 2-14. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a semiconductor structure, the method comprising:

forming an NFET gate and a PFET gate on a surface of a substrate;

forming a raised source and raised drain adjacent to the NFET gate and forming a raised source and raised drain adjacent to the PFET gate;

forming silicide regions on the raised source and raised drain adjacent to the NFET gate and PFET gate;

depositing at least one protective layer over the surface of the semiconductor structure, such that the at least one protective layer covers the gate, raised source, and raised drain of the NFET and the PFET; and planarizing the semiconductor structure to lower the protective layer to the level of the silicide regions, such that the raised source and raised drain of the PFET and NFET, and the PFET and NFET gates are of equal height above the surface of the substrate, thereby forming a planarized surface of the semiconductor structure;

depositing a first film layer over the planarized surface of the semiconductor structure, a second film layer over the first film layer and a third film layer over the second film layer; wherein the first film layer and the third film layer comprise a nitride layer, and wherein the second film layer comprises an oxide layer;

depositing a resist layer over the third film layer; removing a portion of the resist layer, thereby exposing a portion of the third film layer;

removing the exposed portion of the third film layer and a portion of the second film layer underneath the exposed portion of third film layer, thereby creating an opening exposing a portion of the first film layer;

removing the remainder of the resist layer; and
depositing a conformal film layer over the semiconductor structure covering the remaining of the third film layer and sidewalls of the opening.

2. The method of claim 1, further comprising:
removing the exposed portion of the first film layer and a portion of the conformal film layer on top thereof, thereby forming a plurality of contact cavities disposed over the silicide regions.

3. The method of claim 2, further comprising:
removing the remaining conformal film layer; and
removing the remaining third film layer.

4. The method of claim 3, further comprising:
depositing a first metal layer in the plurality of contact cavities; and
depositing a contact metal layer over the first metal layer in the plurality of contact cavities.

5. The method of claim 4, further comprising:
planarizing the contact metal layer to the level of the top of the first film layer; and
recessing the contact metal layer to a level below the top of the first film layer.

6. The method of claim 1, wherein the conformal film layer over the semiconductor structure is a conformal nitride film.

7. The method of claim 2, wherein the step of removing a portion of the conformal film layer and the exposed portion of the first film layer is performed via reactive ion etch.

8. The method of claim 3, wherein the first metal layer is a titanium nitride layer.

9. The method of claim 3, wherein the contact metal layer is a tungsten layer.

10. The method of claim 1, further comprising:
   forming recesses in the substrate adjacent to the PFET gate; and
   growing epitaxial SiGe in the recesses.

11. The method of claim 1, wherein the step of planarizing the semiconductor structure is performed via a chemical mechanical polish process.

12. The method of claim 1, wherein the first film layer is thicker than the third film layer.

* * * * *